United States Patent
Khayat et al.

(10) Patent No.: US 10,903,860 B2
(45) Date of Patent: *Jan. 26, 2021

(54) ERROR CORRECTION CODE (ECC) OPERATIONS IN MEMORY FOR PROVIDING REDUNDANT ERROR CORRECTION

(71) Applicant: Micron Technology, Inc., Boise, ID (US)

(72) Inventors: Patrick R. Khayat, San Diego, CA (US); Sivagnanam Parthasarathy, Carlsbad, CA (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/427,545

(22) Filed: May 31, 2019

(65) Prior Publication Data

US 2019/0288711 A1    Sep. 19, 2019

Related U.S. Application Data

(63) Continuation of application No. 15/461,623, filed on Mar. 17, 2017, now Pat. No. 10,312,944.

(51) Int. Cl.
*H03M 13/00* (2006.01)
*H03M 13/29* (2006.01)
*H03M 13/15* (2006.01)

(52) U.S. Cl.
CPC ... *H03M 13/2948* (2013.01); *H03M 13/2906* (2013.01); *H03M 13/2918* (2013.01); *H03M 13/2927* (2013.01); *H03M 13/2945* (2013.01); *H03M 13/152* (2013.01); *H03M 13/2909* (2013.01)

(58) Field of Classification Search
CPC ......... H03M 13/2948; H03M 13/2906; H03M 13/2918; H03M 13/2927; H03M 13/2945; H03M 13/2909; H03M 13/152
See application file for complete search history.

(56) References Cited

U.S. PATENT DOCUMENTS

| 7,656,322 B2 | 2/2010 | Oda |
| 8,484,544 B2 * | 7/2013 | Anholt ............. H03M 13/1525 714/785 |
| 2001/0050622 A1 | 12/2001 | Hewitt et al. |
| 2004/0117723 A1 | 6/2004 | Foss |
| 2013/0132793 A1 | 5/2013 | Ha et al. |

(Continued)

OTHER PUBLICATIONS

International Search Report and Written Opinion from related international application No. PCT/US2018/021928, dated Jun. 22, 2018, 16 pages.

(Continued)

*Primary Examiner* — Samir W Rizk
(74) *Attorney, Agent, or Firm* — Brooks, Cameron & Huebsch, PLLC

(57) ABSTRACT

Apparatuses and methods for performing an error correction code (ECC) operation are provided. One example method can include encoding data by including parity data for a number of cross-over bits, wherein the number of cross-over bits are bits located at intersections of column codewords and row codewords.

20 Claims, 5 Drawing Sheets

(56) References Cited

U.S. PATENT DOCUMENTS

| | | |
|---|---|---|
| 2015/0155888 A1 | 6/2015 | Moon et al. |
| 2016/0164543 A1 | 6/2016 | Kumar |
| 2016/0315635 A1 | 10/2016 | Cai et al. |
| 2016/0334999 A1 | 11/2016 | Um et al. |
| 2016/0359503 A1 | 12/2016 | Li et al. |
| 2017/0004036 A1 | 1/2017 | Ha et al. |
| 2017/0004037 A1 | 1/2017 | Park et al. |
| 2017/0052845 A1 | 2/2017 | Ware et al. |
| 2017/0077962 A1 | 3/2017 | Yang et al. |
| 2018/0167088 A1 | 6/2018 | Vakilinia et al. |

OTHER PUBLICATIONS

Office Action from related Taiwanese patent application No. 107108956, dated Feb. 20, 2019, 19 pages.

\* cited by examiner

ERROR CORRECTION CODE (ECC) OPERATIONS IN MEMORY FOR PROVIDING REDUNDANT ERROR CORRECTION

PRIORITY INFORMATION

This application is a continuation of U.S. application Ser. No. 15/461,623 filed Mar. 17, 2017, the contents of which are included herein by reference.

TECHNICAL FIELD

The present disclosure relates generally to memory devices, and more particularly, to apparatuses and methods for error correction operations providing redundant error correction.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
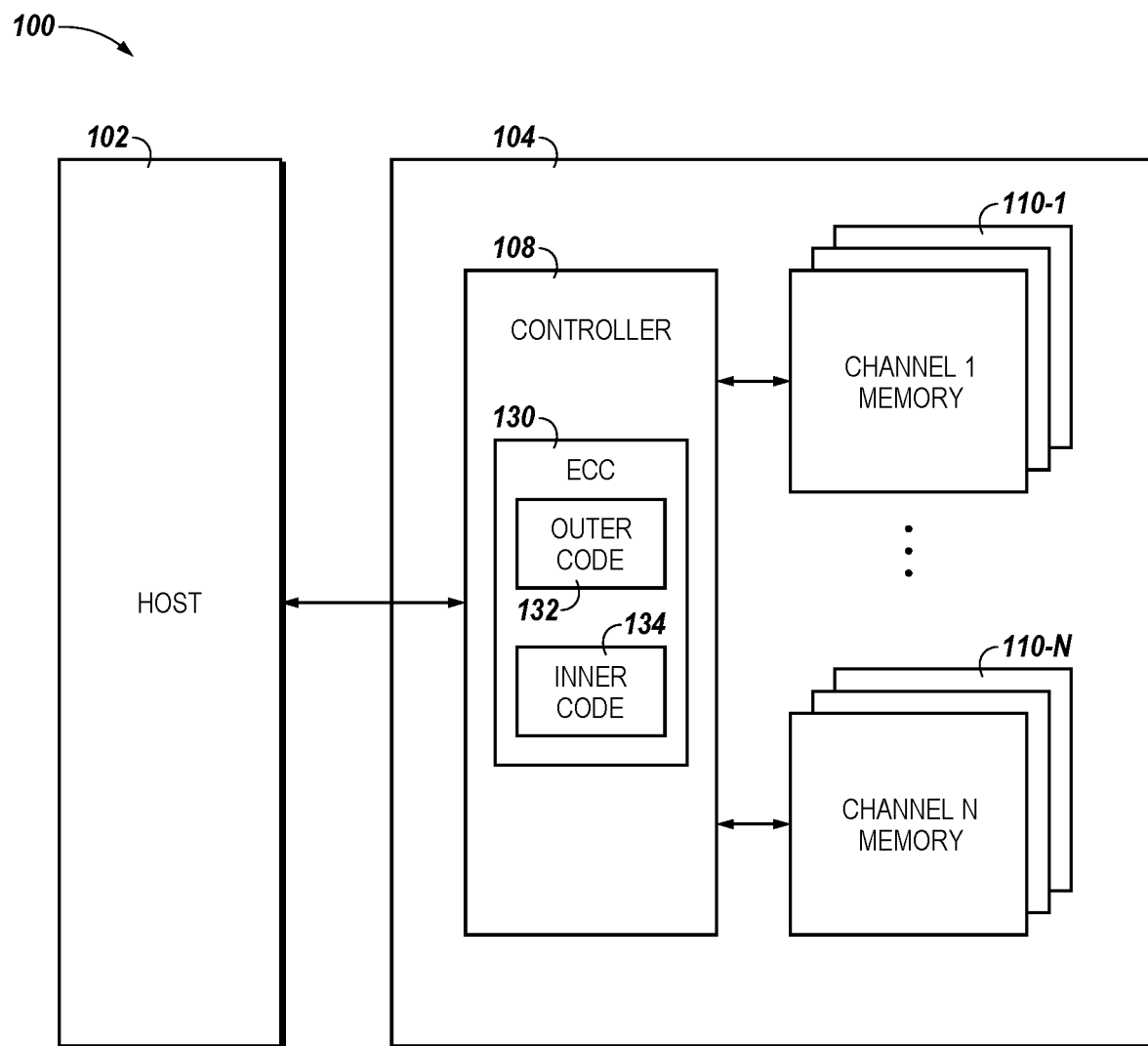
FIG. 1 is a block diagram of an apparatus in the form of a computing system including a memory system in accordance with a number of embodiments of the present disclosure.

Apparatuses and methods for performing an error correction code (ECC) operation are provided. One example method can include encoding data by including parity data for a number of cross-over bits, wherein the number of cross-over bits are bits located at intersections of column codewords and row codewords.

Data can be encoded with a first code, e.g., an outer code, and a second code, e.g., an inner code. The first code can be a BCH code, and the second code can be a block-wise concatenated product code. Also, parity data for cross-over bits that are located at the intersection of column codewords and row codewords can be included when encoding the data. The block-wise concatenated product code can include a plurality of bits located at the intersection of a column codeword and a row code that are protected by the column codeword and the row codeword.

In one or more embodiments of the present disclosure, parity data for cross-over bits can be used to correct errors in data when an error floor, e.g, a stall pattern, has been reached when decoding data. Data that has been encoded with block-wise concatenated codes that is an extension of conventional block codes where the cross-over between a row and a column code is comprised of a plurality of bits. Decoding these types of codes can reach an error floor while performing iterative decoding of the data. The location of the remaining error or errors due to the error floors is likely to be at an intersection of column codewords and row codewords that resulted at decode failures e.g., a higher number of errors than the code can correct. Parity data for cross-over bits located at the intersection of column codewords and row codewords can be used to correct errors that remain due to the error floor. The parity data for the cross-over bits can be stored in memory along with the encoded data and can be created by performing an XOR operation on each set of bits located at the intersection of the column codewords and row codewords.

In a number of embodiments, using the parity data for cross-over bits for the decoding the inner code can increase the correction capability of an ECC operation for a given raw bit error rate (RBER). Therefore, fewer outer code decoders could be used in a memory system and/or could be shared across several channels. Also, the parity data for cross-over bits could provide sufficient correction capability for a system such that an outer code is not needed to correct errors.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of a computing system 100 including an apparatus in the form of at least one memory system 104, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, the memory system 104 can include a controller 108 and one or more memory devices 110-1, . . . , 110-N. In this example, the controller 108 is external to the one or more memory devices 110-1, . . . , 110-N. The memory devices 110-1, . . . , 110-N can provide a storage volume for the memory system, e.g., with a file system formatted to the memory devices. In a number of embodiments, the number of memory devices 110-1, . . . , 110-N can include non-volatile memory including a number of logical units (LUNs). A LUN can be a portion of non-volatile memory that can be independently controllable. The controller 108 can include control circuitry, e.g., hardware, firmware, and/or software. In one or more embodiments, the controller 108 can be an application specific integrated circuit (ASIC) coupled to a printed circuit board including a physical interface and memory devices 110-1, . . . , 110-N. Also, the controller can include volatile and/or non-volatile memory.

The controller 108 can include hardware, firmware, and/or software to perform ECC 130 operations on data, e.g., to correct errors in the data. For example, errors in the state of a memory cell due to threshold voltage shift can be corrected by ECC 130. ECC operations can include regular ECC operations used to correct errors based only on hard data and advanced ECC operations which can use soft data to correct errors. Whether regular ECC and/or advanced ECC is used can depend on the number of cells that are in error, for instance, e.g., a quantity of erroneous bits.

In a number of embodiments of the present disclosure, ECC 130 operations are performed. Data can be encoded with a first code, e.g., an outer code 132, and a second code, e.g., an inner code 134. The first code can be a BCH code, and the second code can be a block-wise concatenated product code. Also, parity data for cross-over bits that are located at the intersection of column codewords and row codewords can be included when encoding the data. The parity data for the cross-over bits can be used to corrects errors located at a particular intersection of a column codeword and row codeword when a decoding operation has reached an error floor and can no longer correct the errors located at the particular intersection of the column codeword and row codeword.

As illustrated in FIG. 1, a host 102 can be coupled to the memory system 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

In one or more embodiments, a physical host interface can be in the form of a standardized interface. For example, when the memory system 104 is used for data storage in a computing system 100, a physical host interface can be a serial advanced technology attachment (SATA), peripheral component interconnect express (PCIe), or a universal serial bus (USB), among other connectors and interfaces. In general, however, a physical host interface can provide an interface for passing control, address, data, and other signals between the memory system 104 and a host 102 having compatible receptors for the physical host interface.

The controller 108 can communicate with the memory devices 110-1, . . . , 110-N to read, write, and erase data, among other operations. Controller 108 can have circuitry that may be one or more integrated circuits and/or discrete components. A controller could selectively couple an I/O connection (not shown in FIG. 1) of a memory device 110-1, . . . , 110-N to receive the appropriate signal at the appropriate I/O connection at the appropriate time. Similarly, the communication protocol between a host 102 and the memory system 104 may be different than what is required for access of a memory device 110-1, . . . , 110-N. Controller 108 can translate the commands received from a host into the appropriate commands to achieve the desired access to a memory device 110-1, . . . , 110-N.

A memory device 110-1, . . . , 110-N can include one or more arrays of memory cells, e.g., non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

In a memory device, a physical page can refer to a unit of writing and/or reading, e.g., a number of cells that are written and/or read together or as a functional group of memory cells. An even page and an odd page can be written and/or read with separate writing and/or reading operations. For embodiments including multilevel cells (MLC), a physical page can be logically divided into, for example, an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, . . . , 110-N. It will be appreciated by those skilled in the art that the number of address input connections can depend on the density and architecture of the memory devices 110-1, . . . , 110-N.

In general, the controller 108 is responsible for converting command packets received from the host 102, e.g., from a PCIe bus, into command instructions for host-memory translation circuitry and for converting memory responses into host system commands for transmission to the requesting host.

In one or more embodiments, data can be written to the memory devices one page at a time. Each page in the memory device can have a number of physical sectors and each physical sector can be associated with a logical block address (LBA). As an example, a physical page can have 8 physical sectors of data. However, embodiments are not limited to a particular number of physical sectors per physical page.

Figure 2:
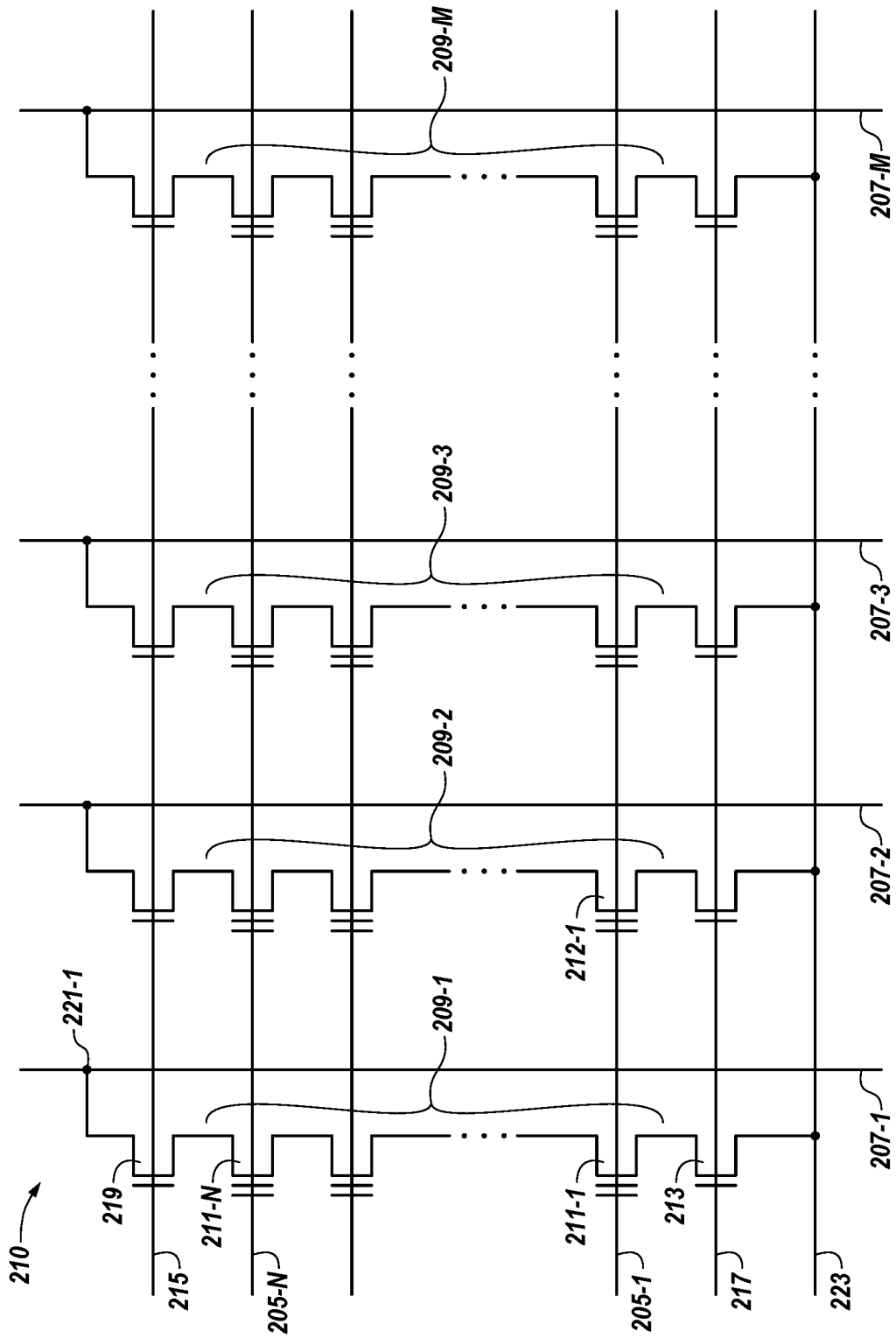
FIG. 2 is a schematic of a portion of memory comprising an array of memory cells operable in accordance with a number of embodiments of the present disclosure.

FIG. 2 is a schematic of a portion of memory 210 comprising an array of memory cells operable in accordance with a number of embodiments of the present disclosure. The embodiment of FIG. 2 illustrates a NAND architecture non-volatile memory array; however, embodiments described herein are not limited to this example. For example, a number of embodiments can be implemented to a NOR architecture non-volatile memory array. As shown in FIG. 2, the memory array includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

The memory array includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a select gate source (e.g., a field-effect transistor (FET) 213) and a select gate drain (e.g., FET 219). Each select gate source 213 is configured to selectively couple a respective NAND string to a common source 223 responsive to a signal on source select line 217, while each select gate drain 219 is configured to selectively couple a respective NAND string to a respective bit line responsive to a signal on drain select line 215.

As shown in the embodiment illustrated in FIG. 2, a source of select gate source 213 is coupled to a common source line 223. The drain of select gate source 213 is coupled to the source of the memory cell 211-1 of the corresponding NAND string 209-1. The drain of select gate drain 219 is coupled to bit line 207-1 of the corresponding NAND string 209-1 at drain contact 221-1. The source of select gate drain 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. For example, one end of each memory cell (e.g., a memory cell 211-N as illustrated in FIG. 2) can be coupled to a bit line, and another end of the same memory cell can be coupled to a source line that can be aligned in parallel with the bit line. Furthermore, a NOR architecture can provide for random access to the memory cells in the array (e.g., as opposed to page-based access as with a NAND architecture).

In operation, a number of memory cells coupled to a selected word line (e.g., 205-1, . . . , 205-N) can be written and/or read together as a group. A group of memory cells written and/or read together can be referred to as a page of cells (e.g., a physical page) and can store a number of pages of data (e.g., logical pages). A number of memory cells coupled to a particular word line and programmed together to respective data states can be referred to as a target page. A programming operation can include applying a number of program pulses (e.g., 16V-20V), which correspond to a particular programming algorithm that is being used to program the memory cell, to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

Figure 3:
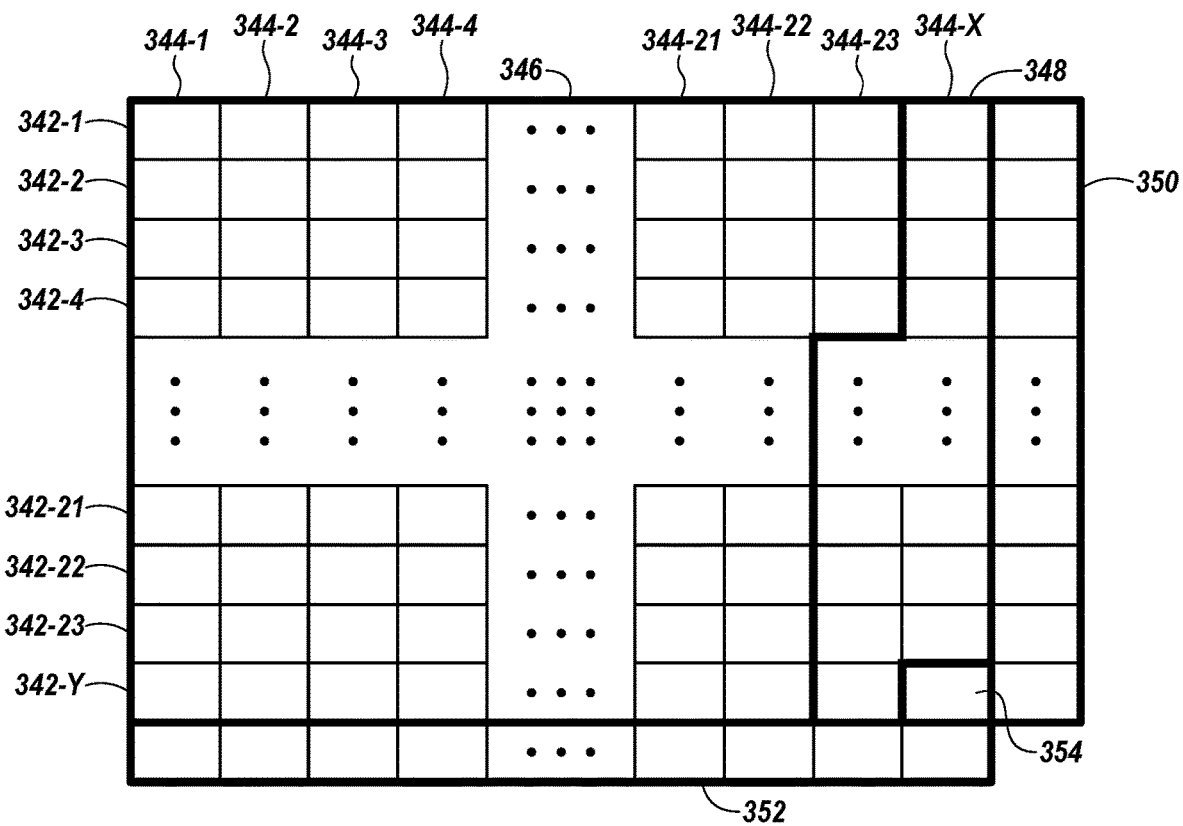
FIG. 3 is a block diagram of encoded data in memory in accordance with a number of embodiments of the present disclosure.

FIG. 3 is a block diagram of encoded data stored in memory in accordance with a number of embodiments of the present disclosure. In FIG. 3, data in encoded with block-wise concatenated product codes. The encoded data is stored in column component codewords 344-1, . . . , 344-X each having a number of bits and row component codewords 342-1, . . . , 342-Y each having a number of bits. The encoded data includes an ECC payload 346, outer code parity data 348, column component codeword parity data 352, and row component codeword parity data 350, and cross-over parity data 354. The cross-over parity data ($P_{co}$) 354 can be stored at the intersection of row codeword 342-X and column codeword 344-Y. The intersections of the column component codewords 344-1, . . . , 344-Y and the row component codewords 342-1, . . . , 342-X include a blocks of bits that are protected by cross-over parity data 354.

Figure 4:
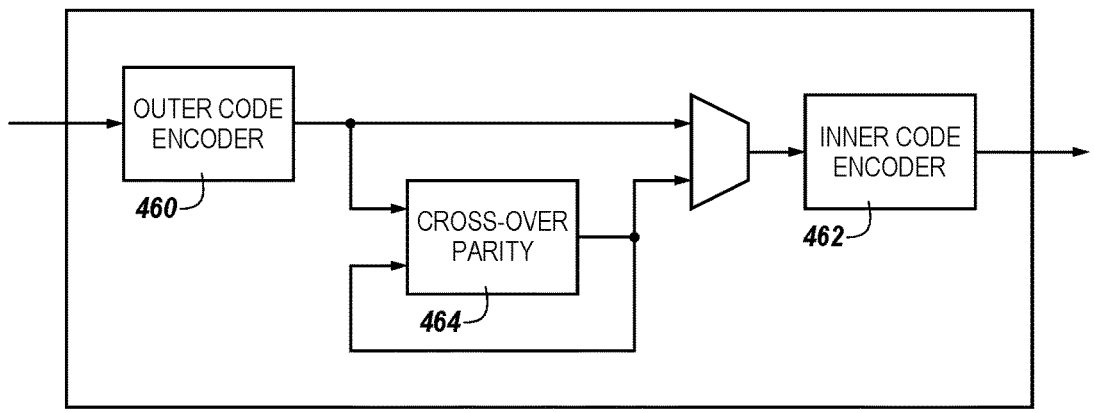
FIG. 4 is a block diagram of a write path in accordance with a number of embodiments of the present disclosure.

FIG. 4 is a block diagram of a write path in accordance with a number of embodiments of the present disclosure. In FIG. 4, write operation can include encoding data with an outer code encoder 460, creating the cross-over parity data 464, and encoding the data (e.g., user data, outer code parity data, and/or cross-over parity data) with an inner code encoder 462. The cross-over parity data can be created by performing an XOR operation on the block of bits located at an intersection of a row component codeword and a column component codeword, e.g., column codewords 344-1, . . . , 344-24 and row codewords 342-1, . . . , 342-24 in FIG. 3. The cross-over parity data can then be used to correct errors located at a particular intersection of a row codeword and a column codeword when a decoding operation, e.g., inner code decoding, has reached an error floor and cannot correct the errors located at the particular intersection of a row codeword and a column codeword.

Figure 5:
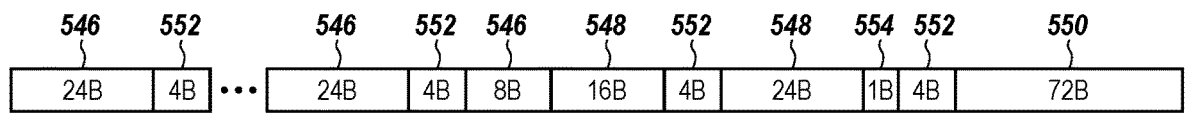
FIG. 5 is a block diagram of encoded data written to memory in accordance with a number of embodiments of the present disclosure.

FIG. 5 is a block diagram of encoded data written to memory in accordance with a number of embodiments of the present disclosure. In FIG. 5, data is streamed out of the encoders 460, 462, and 464 as ECC payload 546 followed by column component codeword parity data 552. The data stream then continues with outer code parity data 548 and column component codeword parity data 552. The data stream continues with cross-over bit parity 354, column component codeword parity data 552, and row component codeword parity data 350.

Figure 6:
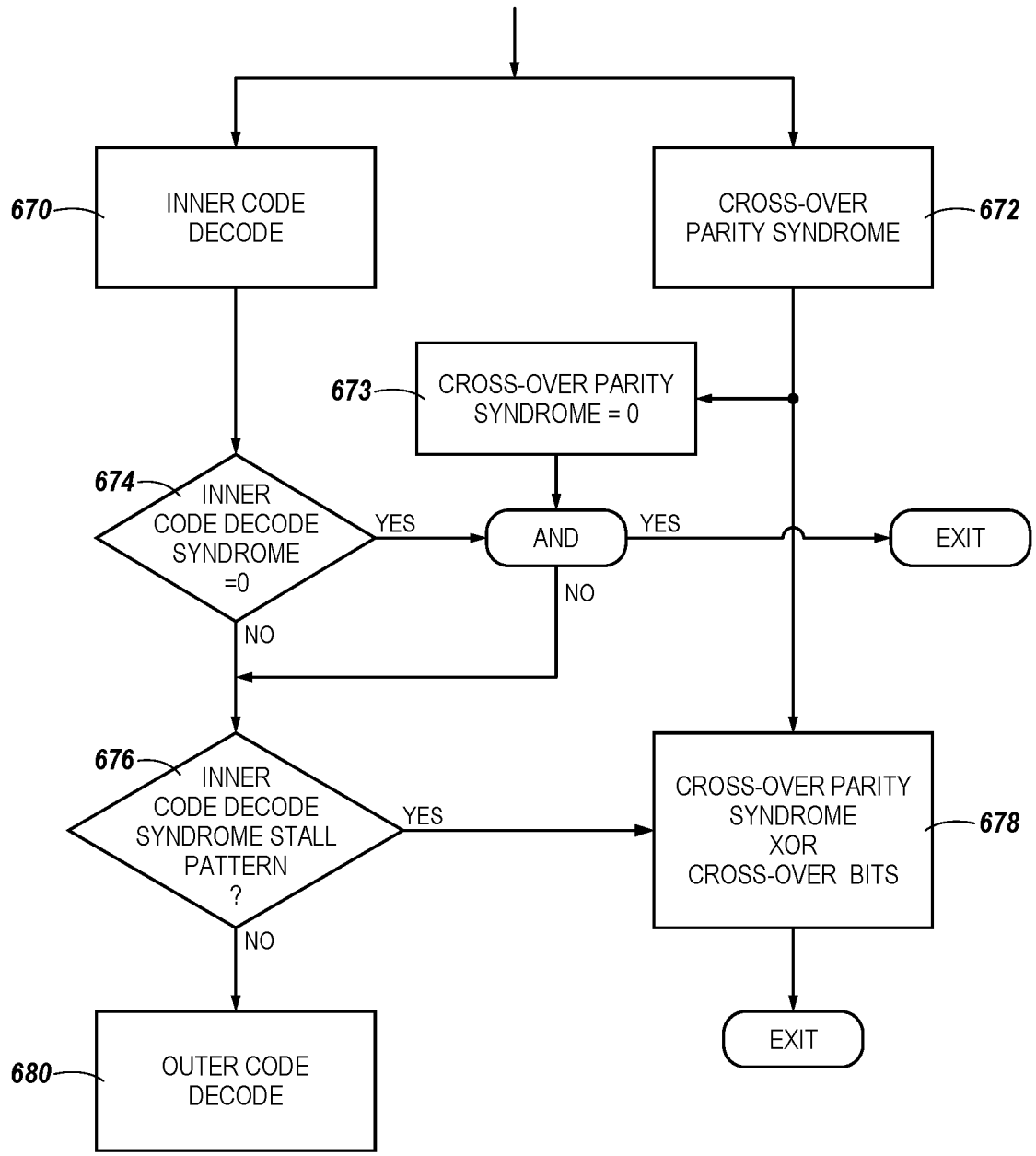
FIG. 6 illustrates a flow diagram for an error correction code (ECC) operation in accordance with a number of embodiments of the present disclosure.

FIG. 6 illustrates a flow diagram for an error correction code (ECC) operation in accordance with a number of embodiments of the present disclosure. As encoded data is read from an array of memory cells, an inner code decoding 670 operation is completed to correct errors in the data. Also, a cross-over parity syndrome 672 is computed for the blocks of data located at the intersections of the row component codewords and the column component codewords. As the inner code decoding process 670 corrects errors in the data, the cross-over parity syndrome 672 is updated.

Upon completion of the inner code decoding 670 operation, if all of the inner code decode syndromes 674 are 0 and/or if the cross over parity syndrome 673 is equal to 0 then the decoding process is complete, as all errors in the data have been corrected. If there are any inner code decode syndromes 674 that are not equal to 0 and/or if the cross over parity syndrome 673 does not equal 0, then the decoding process continues. In response to an inner code decode syndrome 674 not being equal to 0 and/or the cross over parity syndrome 673 not being equal to 0 and there is a 11 stall pattern 676, e.g., an error floor of the inner code decoding process is located at a particular intersection of a row component codeword and a column component codewords, an XOR operation is performed on the cross-over parity syndrome and the cross-over data 678 to correct the errors located at the particular intersection of the row component codeword and the column component codewords. If there is not a 11 stall pattern 676, e.g., an error floor of the inner code decoding process is located at a particular intersection of a row component codeword and a column component codewords, in response to the inner code decode syndrome 674 not being equal to 0, the decoding process continues by performing an outer code decoding 680 operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for performing an error correction code (ECC) operation, comprising:
creating parity data for a number of cross-over bits by performing an XOR operation on set of bits located at an intersection of column codewords and row codewords;
encoding data and the parity data;
decoding the data using the parity data and computing a cross-over parity syndrome; and
correcting an error in the data by performing an XOR operation on the cross-over parity syndrome and the parity data.

2. The method of claim 1, wherein the method includes performing the XOR operation on the cross-over parity syndrome and the parity data in response to reaching an error floor when decoding the data.

3. The method of claim 1, wherein the method includes encoding the data and the parity data with block-wise concatenated product codes.

4. The method of claim 1, wherein the method includes storing the encoded data in column component codewords.

5. The method of claim 1, wherein the method includes correcting errors in the data located at a particular intersection.

6. A method for performing an error correction code (ECC) operation, comprising:
encoding data with a first code;
creating parity data for a number of cross-over bits by performing an XOR operation on set of bits located at an intersection of column codewords and row codewords;
encoding the data and the parity data with a second code;
decoding the data using the parity data and computing a cross-over parity syndrome; and
correcting errors in the data by performing an XOR operation on the cross-over parity syndrome and the parity data.

7. The method of claim 6, wherein the first code is a BCH code.

8. The method of claim 6, wherein the second code is a block-wise concatenated product code.

9. The method of claim 6, wherein the method includes storing the encoded data in an array of memory cells.

10. The method of claim 6, wherein the method includes storing the encoded parity data in an array of memory cells.

11. The method of claim 10, wherein the method includes storing the encoded parity data in a portion of codewords stored in the array.

12. The method of claim 6, wherein the method includes creating the parity data while encoding the data with the first code.

13. An apparatus, comprising:
a memory device;
a controller coupled to the memory device, wherein the controller is configured to:
create parity data for a number of cross-over bits by performing an XOR operation on sets of bits located at an intersection of column codewords and row codewords;
encode data and the parity data via a first encoder;
decode the data using the parity data and compute a cross-over parity syndrome; and
correct a first error in the data by performing an XOR operation on the cross-over parity syndrome in response to reaching an error floor when decoding the data.

14. The apparatus of claim 13, wherein the controller is configured to update the cross-over parity syndrome based on a second error that is corrected during the decode.

15. The apparatus of claim 13, wherein the controller is configured to update the cross-over bits based on a number of non-zero bits in the cross-over parity syndrome.

16. The apparatus of claim 13, wherein the controller is configured to decode the data using a product code decoding operation.

17. The apparatus of claim 13, wherein the controller is configured to determine that a particular column codeword has a non-zero syndrome during the decode.

18. The apparatus of claim 13, wherein the controller is configured to determine that a particular row codeword has a non-zero syndrome during the decode.

19. The apparatus of claim 13, wherein the first encoder is a BCH encoder.

20. The apparatus of claim 13, further comprising a second encoder, wherein the second encoder is a block-wise concatenated encoder.

* * * * *